US009236224B2

(12) United States Patent
Morita (10) Patent No.: US 9,236,224 B2
(45) Date of Patent: Jan. 12, 2016

(54) DRAWING APPARATUS AND METHOD OF MANUFACTURING ARTICLE

(71) Applicant: CANON KABUSHIKI KAISHA, Tokyo (JP)

(72) Inventor: Tomoyuki Morita, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 42 days.

(21) Appl. No.: 14/256,173

(22) Filed: Apr. 18, 2014

(65) Prior Publication Data
US 2014/0322927 A1    Oct. 30, 2014

(30) Foreign Application Priority Data

Apr. 26, 2013    (JP) .................................. 2013-094640

(51) Int. Cl.
| | |
|---|---|
| H01J 37/20 | (2006.01) |
| H01J 37/30 | (2006.01) |
| H01J 37/317 | (2006.01) |
| H01L 21/268 | (2006.01) |

(52) U.S. Cl.
CPC ............. *H01J 37/3174* (2013.01); *H01J 37/20* (2013.01); *H01J 37/3005* (2013.01); *H01J 37/3177* (2013.01); *H01L 21/268* (2013.01); *H01J 2237/20292* (2013.01); *H01J 2237/31761* (2013.01)

(58) Field of Classification Search
USPC ............... 250/396 R, 397, 398, 492.1, 492.2, 250/492.21, 492.22, 492.23, 492.3, 494.1
See application file for complete search history.

(56) References Cited

U.S. PATENT DOCUMENTS

| | | | |
|---|---|---|---|
| 7,049,210 B2 | 5/2006 | Murrell et al. | |
| 8,859,983 B2 * | 10/2014 | Wieland | 250/396 R |
| 2010/0078631 A1 | 4/2010 | Pieh | |
| 2011/0053087 A1 | 3/2011 | Nielsen et al. | |
| 2014/0319367 A1 * | 10/2014 | Muraki et al. | 250/397 |
| 2015/0129779 A1 * | 5/2015 | Morita et al. | 250/453.11 |
| 2015/0131075 A1 * | 5/2015 | Kato et al. | 355/77 |

FOREIGN PATENT DOCUMENTS

| | | |
|---|---|---|
| CN | 1691269 A | 11/2005 |
| CN | 101300656 A | 11/2008 |

(Continued)

OTHER PUBLICATIONS

Office Action issued in TW103111474, mailed May 8, 2015. English translation provided.

(Continued)

*Primary Examiner* — Bernard E Souw
(74) *Attorney, Agent, or Firm* — Rossi, Kimms & McDowell LLP (57) ABSTRACT

A drawing apparatus includes: plural charged particle optical systems arrayed at a pitch in a first direction, each configured to irradiate a substrate with charged particle beams; a stage configured to hold the substrate and be moved relative to the charged particle optical systems in a second direction orthogonal to the first direction; and a controller configured to determine charged particle beams for the drawing with respect to each charged particle optical system so as to satisfy a relation given by $SW = Pc/\alpha = Ps/\beta$ where Ps is an array pitch of shot regions in the first direction, SW is a width, in the first direction, of each drawing region by each charged particle optical system, Pc be an array pitch of drawing regions in the first direction, and $\alpha$ and $\beta$ are natural numbers.

10 Claims, 6 Drawing Sheets

(56) References Cited

FOREIGN PATENT DOCUMENTS

| | | | |
|---|---|---|---|
| GB | 2263335 | A | 7/1993 |
| JP | 62-144323 | A | 6/1987 |
| JP | 3832914 | B2 | 10/2006 |
| JP | 4308504 | B2 | 5/2009 |
| TW | 208757 | B | 7/1993 |
| TW | 200518101 | A | 6/2005 |
| WO | 2009097859 | A1 | 8/2009 |

OTHER PUBLICATIONS

Office Action issued in CN201410164563.4, mailed Oct. 8, 2015. English translation provided.

* cited by examiner

DRAWING APPARATUS AND METHOD OF MANUFACTURING ARTICLE

BACKGROUND OF THE INVENTION

1. Field of the Invention

The present invention relates to a drawing apparatus for performing drawing on a substrate with a plurality of charged particle beams, and a method of manufacturing an article.

2. Description of the Related Art

As a drawing apparatus used to manufacture a device such as a semiconductor integrate circuit, Japanese Patent Laid-Open No. 62-144323 proposes a drawing apparatus that performs drawing simultaneously on a plurality of shot regions of a substrate using a plurality of electron optical systems (charged particle optical systems) to increase the productivity. When simultaneously performing drawing using a plurality of electron optical systems, the total quantity of drawing pattern data held and handled by the electron optical systems increases in accordance with the number of electron optical systems. In many cases, however, patterns having the same shape are drawn on the plurality of shot regions.

In the drawing apparatus described in Japanese Patent Laid-Open No. 62-144323, drawing data used by the plurality of electron optical systems are shared by the plurality of shot regions. The drawing is performed simultaneously on the plurality of shot regions using the same drawing data, thereby reducing the scale of drawing data to be held and handled. Additionally, in the drawing apparatus described in Japanese Patent Laid-Open No. 62-144323, a plurality of electron optical systems each including an independent correction device are periodically arranged. When performing overlay drawing on an already drawn underlayer pattern, the position of the drawing pattern to be overlaid is corrected for each electron optical system based on the shape of the underlayer pattern.

Figure 1:
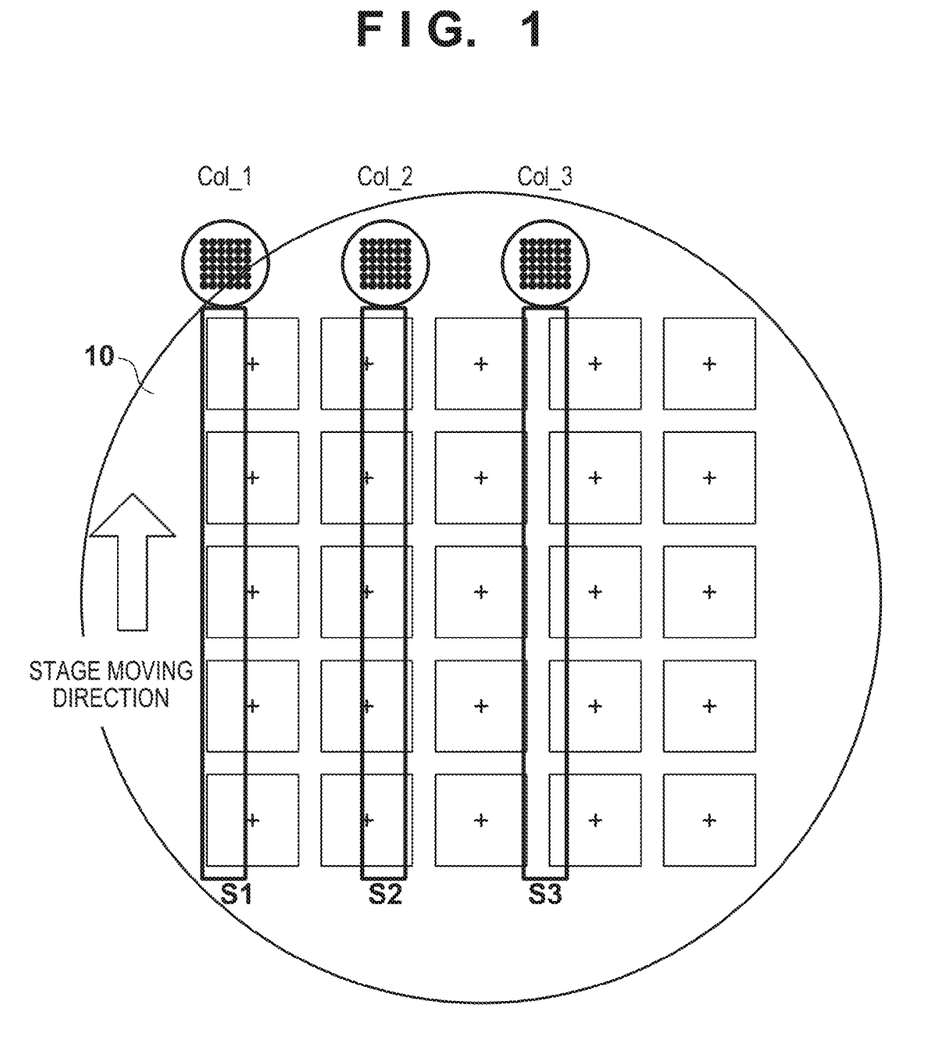
FIG. 1 is a view showing a state in which drawing is performed simultaneously on a plurality of shot regions using a plurality of such electron optical systems.

FIG. 1 shows a state in which drawing is performed simultaneously on a plurality of shot regions of a wafer using a plurality of such electron optical systems. In FIG. 1, drawing is performed on 5 (rows)×5 (columns)=25 shot regions on a wafer 10 using three electron optical systems. Each of three electron optical systems Col_1, Col_2, and Col_3 can project a plurality of or 5 (rows)×5 (columns) electron beams to the wafer 10.

When the wafer 10 is moved to the upper side of FIG. 1 with respect to the electron optical systems Col_1, Col_2, and Col_3 by a stage (not shown) on which the wafer 10 is placed, the electron optical systems Col_1 to Col_3 draw stripe regions S1 to S3, respectively. In this stripe drawing, multiple drawing is performed on the wafer 10 by the plurality of electron beams of the electron optical systems which are arrayed in the moving direction of the wafer 10 (column direction). The irradiating doses of the electron beams on the wafer 10 are controlled by on/off-controlling irradiation of the electron beams.

The irradiating doses of the electron beams are controlled repetitively using drawing data generated from design data in advance. Drawing data necessary for the electron optical systems Col_1 to Col_3 to simultaneously perform drawing is drawing data for the widths of the stripe regions S1 to S3. Since the drawing position changes between the shot regions, as shown in FIG. 1, the drawing data changes between the electron optical systems. It is therefore necessary to redundantly generate drawing data that changes between the electron optical systems in advance and hold the data, resulting in an increase in the total quantity of drawing data.

To solve this problem, Japanese Patent No. 4308504 describes electron beam drawing capable of mechanically adjusting the distances between the optical axes of a plurality of electron optical systems.

However, the method described in Japanese Patent No. 4308504 which mechanically adjusts the distances between the optical axes of electron optical systems to shared drawing data by the electron optical systems has a problem of mechanical adjustment precision and drawing precision.

SUMMARY OF THE INVENTION

The present invention provides, for example, a technique advantageous in terms of common drawing data and drawing precision.

The present invention in its first aspect provides a drawing apparatus for performing drawing on a substrate with a charged particle beam, the apparatus comprising: a plurality of charged particle optical systems each configured to irradiate the substrate with a plurality of charged particle beams, the plurality of charged particle optical systems being arrayed at a pitch in a first direction; a stage configured to hold the substrate and be moved relative to the plurality of charged particle optical systems in a second direction orthogonal to the first direction; and a controller configured to determine charged particle beams, of the plurality of charged particle beams, to be used for the drawing with respect to each of the plurality of charged particle optical systems so as to satisfy a relation given by $SW=Pc/\alpha=Ps/\beta$, where Ps is an array pitch of shot regions on the substrate in the first direction, SW is a width, in the first direction, of each of a plurality of drawing regions on the substrate by each of the plurality of charged particle optical systems, Pc is an array pitch of the plurality of drawing regions in the first direction, and $\alpha$ and $\beta$ are natural numbers.

The present invention in its second aspect provides a method of manufacturing an article, the method comprising: performing drawing on a substrate using a drawing apparatus; developing the substrate on which the drawing has been performed; and processing the developed substrate to manufacture the article, wherein the drawing apparatus performs drawing on the substrate with a charged particle beam, and includes: a plurality of charged particle optical systems each configured to irradiate the substrate with a plurality of charged particle beams, the plurality of charged particle optical systems being arrayed at a pitch in a first direction; a stage configured to hold the substrate and be moved relative to the plurality of charged particle optical systems in a second direction orthogonal to the first direction; and a controller configured to determine charged particle beams, of the plurality of charged particle beams, to be used for the drawing with respect to each of the plurality of charged particle optical systems so as to satisfy a relation given by $SW=Pc/\alpha=Ps/62$, where Ps is an array pitch of shot regions on the substrate in the first direction, SW is a width, in the first direction, of each of a plurality of drawing regions on the substrate by each of the plurality of charged particle optical systems, Pc is an array pitch of the plurality of drawing regions in the first direction, and $\alpha$ and $\beta$ are natural numbers.

Further aspects of the present invention will become apparent from the following description of exemplary embodiments with reference to the attached drawings.

DESCRIPTION OF THE EMBODIMENTS

An embodiment of a drawing apparatus for performing drawing simultaneously on a plurality of shot regions of a substrate using a plurality of charged particle optical systems which are arranged along a first direction and each of which is capable of emitting a plurality of charged particle beams to the substrate will be described below. Note that the same reference numerals denote the same members and the like throughout the drawings for explaining the embodiment, and a repetitive description thereof will be omitted.

[Drawing Apparatus]

Figure 2:
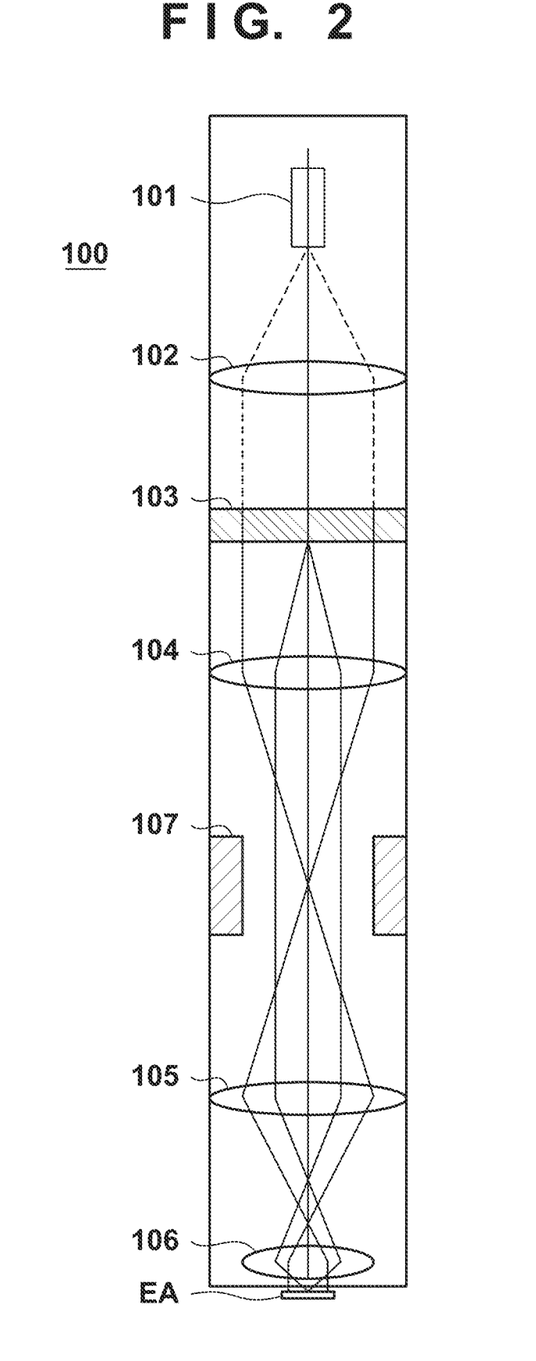
FIG. 2 is a view showing the arrangement of an electron optical system.

FIG. 2 is a view showing the arrangement of a charged particle optical system (electron optical system) 100 that projects charged particle beams to a substrate. An electron source 101 is a so-called thermoelectron (thermal electron) emission electron source including, for example, $LaB_6$ or BaO/W (dispenser cathode) as an electron emitting material. A collimator lens 102 is, for example, an electrostatic lens configured to converge an electron beam by an electric field. An electron beam emitted by the electron source 101 changes to an almost parallel electron beam via the collimator lens 102.

A blanking aperture array 103 divides the almost parallel electron beam from the collimator lens 102 into a plurality of electron beams by two-dimensionally arrayed apertures (not shown). Irradiation of a drawing region EA of the electron optical system 100 with the plurality of divided electron beams is on-off-controlled by an individually drivable electrostatic blanker (not shown). Note that blanking (irradiation off) of an electron beam can be performed by, for example, an arrangement including a deflector, but may be done by another arrangement. An electrostatic electron lens 104 and a magnetic field electron lens 105 form an intermediate image of the plurality of apertures of the blanking aperture array 103 by their lens effects. A magnetic field electron lens 106 acts as an objective lens and projects the intermediate image onto the drawing region EA. A deflector 107 deflects the plurality of electron beams that have passed through the blanking aperture array 103 in a predetermined direction at once, thereby moving the drawing position.

Figure 3:
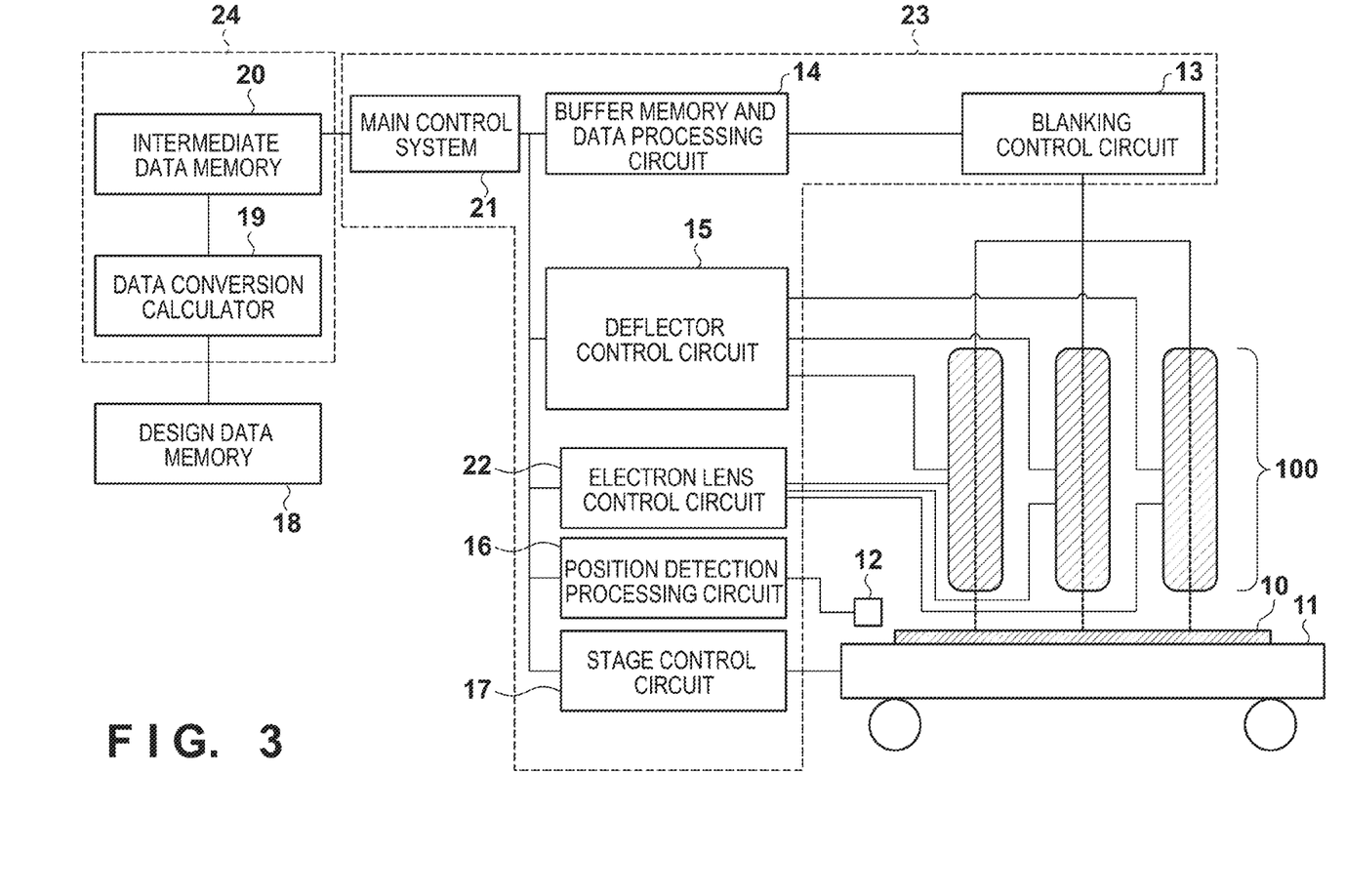
FIG. 3 is a block diagram showing the arrangement of a drawing apparatus according to the present invention.

FIG. 3 is a block diagram showing the arrangement of the drawing apparatus for performing drawing simultaneously on a plurality of shot regions of a substrate using a plurality of electron optical systems. Note that the drawing apparatus according to this embodiment performs drawing on a substrate by a plurality of electron beams. However, a charged particle beam other than the electron beam, for example, an ion beam may be used. The drawing apparatus can be generalized as a drawing apparatus for performing drawing on a substrate by a plurality of charged particle beams. The drawing apparatus according to this embodiment includes three electron optical systems 100. A stage 11 holds a substrate (wafer) 10 and when performing drawing, can move along a first direction and a second direction perpendicular to the first direction relative to the plurality of electron optical system 100. The stage 11 includes an electrostatic chuck (not shown) configured to hold the wafer 10, and an electron beam detector (not shown) including an opening pattern where the electron beams enter and configured to detect the positions of the electron beams. A detector 12 irradiates an alignment mark formed on the wafer 10 with light having a wavelength to which a resist is not sensitive, and detects a specularly reflected image from the mark by an image sensor.

A blanking control circuit 13 individually controls the blanking aperture arrays 103 of the electron optical systems 100. A buffer memory and data processing circuit 14 generates control data of the blanking control circuit 13 for the electron optical systems 100. A deflector control circuit 15 individually controls the deflection amounts of the deflectors 107 of the electron optical systems 100. An electron lens control circuit 22 controls the electron lenses 104 to 106 to adjust the projection magnifications (reduction ratios) of the electron optical systems 100. A position detection processing circuit 16 calculates errors such as shift and rotation of a pattern (shot region) formed on the wafer 10 based on a signal from the detector 12. A stage control circuit 17 controls the position of the stage 11 in cooperation with laser interferometers (not shown) configured to measure the position of the stage 11.

A design data memory 18 stores design data of a pattern to be drawn by the drawing apparatus. A data conversion calculator 19 divides the design data into stripe units (partial regions) having a width set by the drawing apparatus, thereby converting the data into intermediate data to facilitate subsequent processing. An intermediate data memory (storage) 20 stores the intermediate data of each partial region. In accordance with a pattern to be drawn, a main control system 21 transfers the intermediate data to the buffer memory of the buffer memory and data processing circuit 14 and controls the above-described plurality of control circuits and processing circuits, thereby generally controlling the drawing apparatus.

The data conversion calculator 19 and the intermediate data memory 20 constitute a generation device 24 configured to generate drawing data to be used by the drawing apparatus. The main control system 21, the blanking control circuit 13, the buffer memory and data processing circuit 14, the deflector control circuit 15, the electron lens control circuit 22, the position detection processing circuit 16, and the stage control circuit 17 constitute a controller 23 configured to control drawing by the drawing apparatus.

Figure 4A:
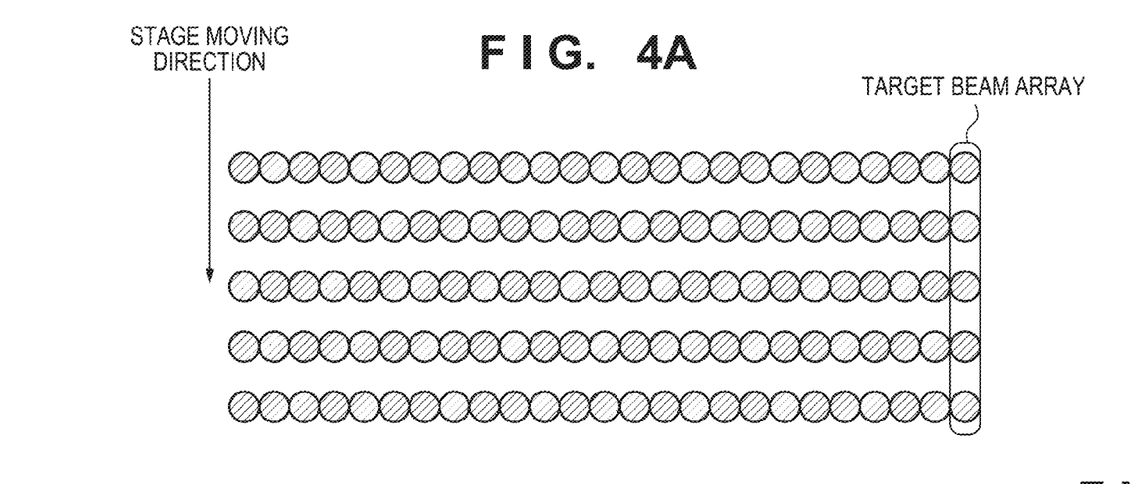
FIGS. 4A to 4C are views for explaining a drawing method of the drawing apparatus according to the present invention.
Figure 4B:
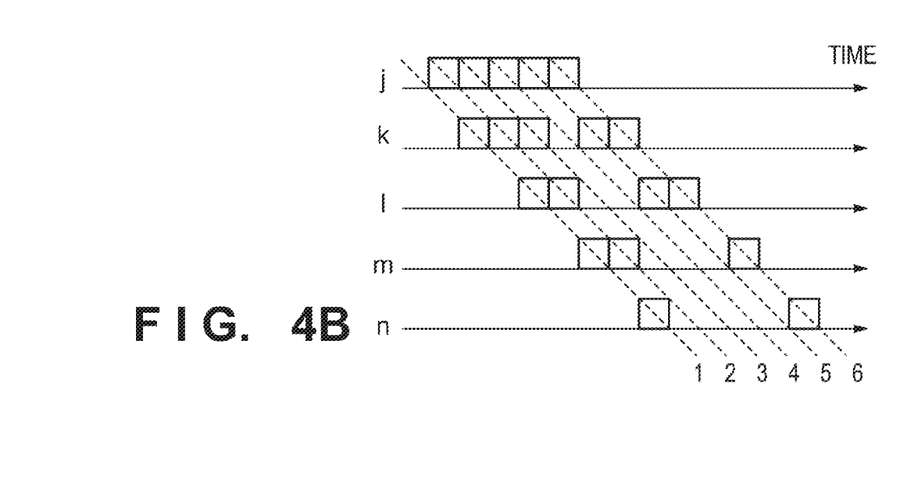
Figure 4C:
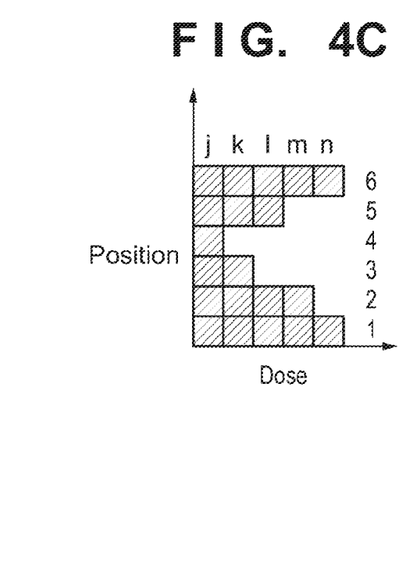

FIGS. 4A to 4C are views for explaining a drawing method of the drawing apparatus according to the present invention. FIG. 4A illustrates an example of the array of electron beams on the drawing region of the electron optical system 100. In this embodiment, the electron beams include 5 (rows)×20 (columns) electron beams. The row pitch is twice larger than the column pitch. As shown in FIG. 4A, the stage 11 moves from the upper side to the lower side of the drawing. A method of performing drawing using an exposure pattern of a designated exposure dose at positions 1 to 6 where the electron beams shown in FIG. 4A are arrayed in the row direction of the electron beams on the wafer 10 as shown in FIG. 4B will be explained here. Assume that all electron beams irradiate the wafer 10 by the same clock, and five rows of the target electron beam array are represented by j to n. The stage 11 is assumed to continuously move at a speed to move by the row pitch on a unit clock basis.

At this time, when the electron beams of the rows j to n of the target electron beam array are controlled by a time table of on/off control signals on a unit clock basis as shown in FIG.

4C, an exposure pattern as shown in FIG. 4B is obtained. Referring to FIG. 4B, signals located on broken lines 1 to 6 are the above-described on/off control signals of the electron beams of the rows j to n exposed at positions 1 to 6 arrayed in the row direction of the electron beams on the wafer 10.

The irradiation positions of the electron beams of the rows j to n on the wafer 10 are moved by the stage 11 that moves in the column direction by the row pitch on a unit clock basis. For this reason, since the position of an electron beam on a given row on the wafer 10 reaches the drawing position of a preceding row two clocks later, the control signal of each row shifts in the time direction by two clocks. That is, the exposure pattern shown in FIG. 4B is obtained by integrating the doses of five electron beams on the rows j to n. Since the tone of the exposure pattern is controlled by the number of rows in the on state, the exposure pattern is obtained only after the electron beams of all rows end the drawing. When 5 (rows)×20 (columns)=a total of 100 electron beams are controlled by the method shown in FIGS. 4A to 4C, stripe regions can be drawn by one electron optical system 100. The width of the stripe region drawn by each electron optical system 100 in a direction perpendicular to the stage moving direction will be referred to as a width SW0 of a drawing enable region.

Figure 5A:
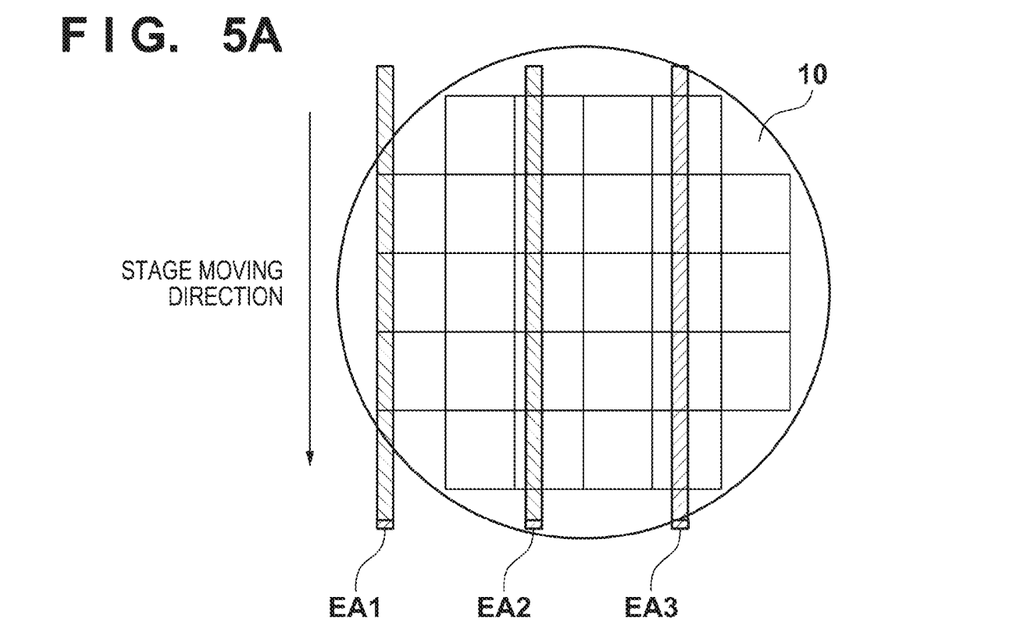
FIGS. 5A and 5B are views for explaining a drawing method of the drawing apparatus according to the present invention.
Figure 5B:
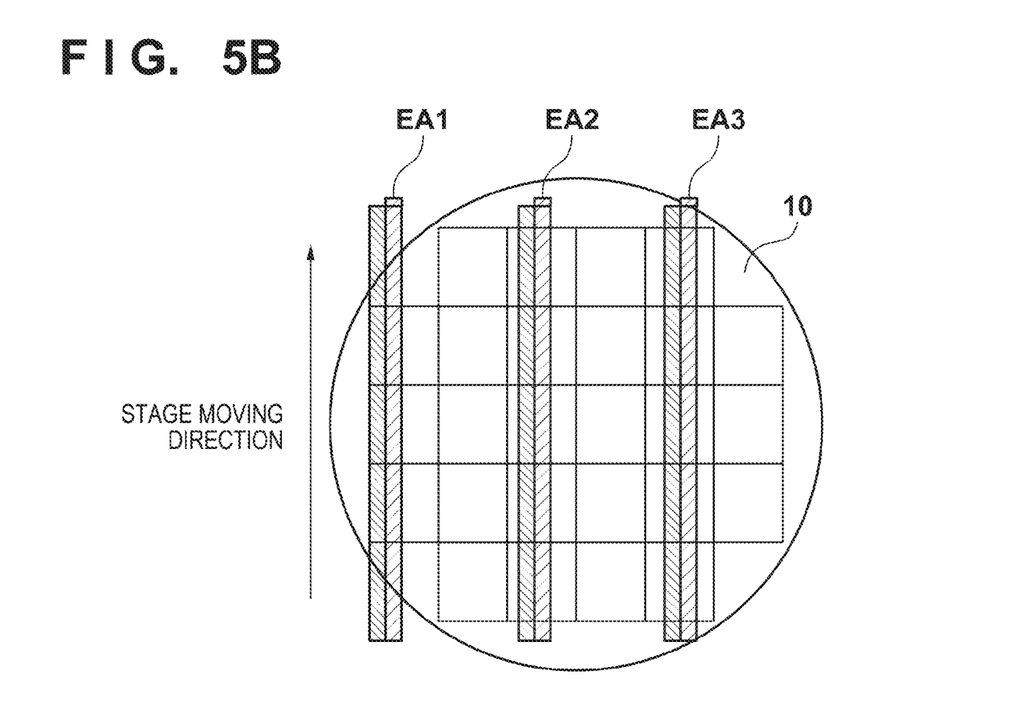

FIGS. 5A and 5B are views for explaining a method of performing drawing on the wafer 10 using the three electron optical systems 100. FIG. 5A is a view showing a state in which a pattern is drawn on shot regions SH periodically arranged in the vertical and horizontal directions on the wafer 10 using the three electron optical systems 100. During one scan movement of the stage 11, the three electron optical systems 100 draw stripe regions EA1 to EA3, respectively. When each electron optical system 100 completes stripe drawing of one column, the main control system 21 moves the stage 11 stepwise in a direction perpendicular to the stage scan direction and performs next stripe drawing. FIG. 5B shows the state. When scan movement of the stage 11, stripe drawing by the electron optical systems 100, and step movement of the stage 11 are repeated, drawing can be performed all over the plurality of shot regions periodically arranged in the vertical and horizontal directions.

Figure 6A:
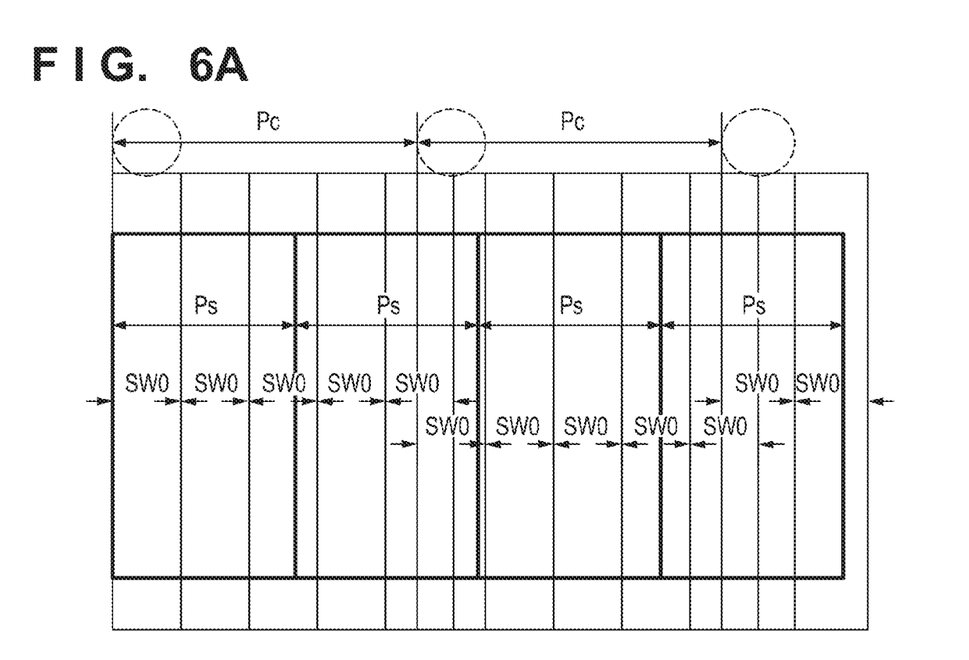
FIGS. 6A and 6B are views for explaining the relationship between the array pitch of shots, the arrangement pitch of electron optical systems, and the stripe drawing width.
Figure 6B:
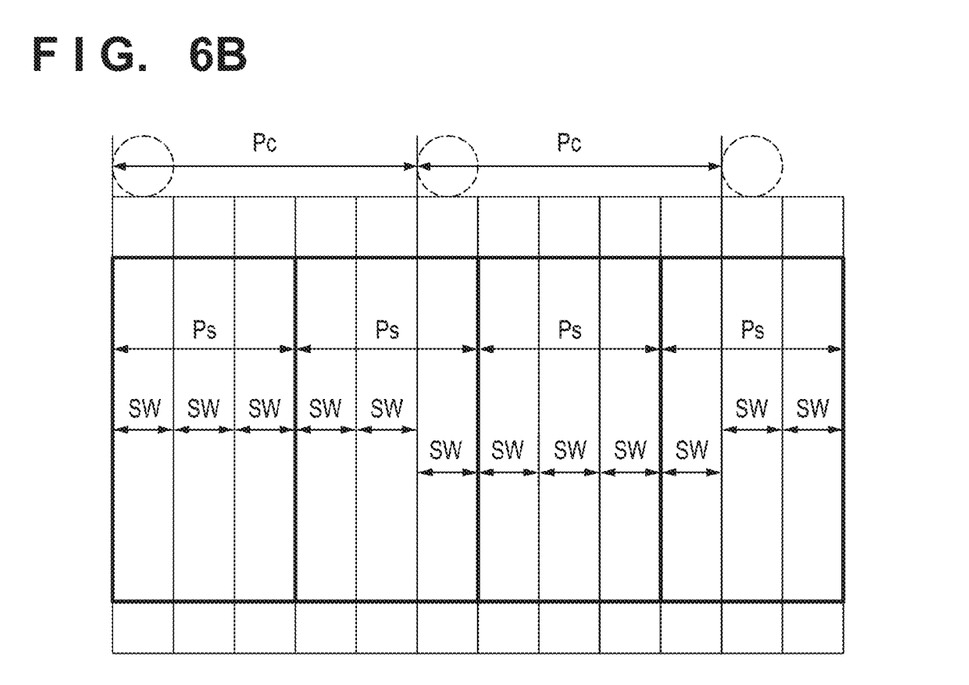

FIGS. 6A and 6B are views for explaining the relationship between an array pitch Ps of the shot regions SH, a common width SW of the drawing regions of one electron optical system 100, and an array pitch Pc of the drawing regions of the electron optical systems 100 in a direction perpendicular to the stage scan direction. Note that the array pitch Ps of the shot regions SH is not an actual value or a measured value of the shot regions formed on the wafer 10 but a nominal value or a design value (value in process design). In the present invention, the array pitch Pc of the drawing regions of the electron optical systems 100 can be changed without changing the interval, that is, the pitch of the electron optical systems 100. The arrangement pitch of the plurality of electron optical systems 100 needs to be a predetermined distance or more mainly due to mechanical constraints of the arrangement of the electron optical systems 100. Under the constraints, the plurality of electron optical systems 100 are arranged such that the arrangement pitch in the direction perpendicular to the stage scan direction becomes a predetermined pitch. One or more chip arrays are formed in the shot regions SH. The pitch Ps of the shot regions SH in the direction perpendicular to the stage scan direction changes depending on the design of the device to be manufactured.

Each electron optical system 100 can perform stripe drawing in an arbitrary width within the range of the width SW0 of the drawing enable region. From the viewpoint of productivity, the width SW of the drawing region of each electron optical system 100 in the direction perpendicular to the stage scan direction is ideally the maximum width, that is, the width SW0 of the drawing enable region. However, when each electron optical system 100 performs stripe drawing in the width SW0, the boundary line that divides one shot region SH by stripes changes between the shot regions or the electron optical systems, as shown in FIG. 6A. To perform drawing while coping with such a situation, intermediate data held in the intermediate data memory 20 changes between the shot regions or the electron optical systems. As a result, it is necessary to redundantly hold data in which only the position of the boundary line that divides a shot region by stripes changes for each shot region or electron optical system, resulting in an increase in the storage scale of the memory or the like.

In FIG. 6A, a stripe can extend over a plurality of shot regions SH. When performing overlay drawing on an already drawn underlayer pattern, first, the detector 12 detects the position of a mark provided on the underlayer pattern. The main control system 21 causes the position detection processing circuit 16 to obtain in advance information about the position (for example, shift, magnification, and rotation) of one of a shot region formed on the underlayer and a portion in it based on the output of the detector 12. After that, the independent deflector 107 of each electron optical system 100 individually corrects the drawing position of the pattern to be overlaid on the underlayer pattern, that is, corrects the drawing position on a stripe basis based on the information of the position. The correction amount of the drawing position changes between the shot patterns. Hence, when a stripe extends over adjacent shot regions, it is impossible to simultaneously correct the drawing positions in both shot regions and perform drawing by the same stripe.

The present invention solves the above-described problem by determining a group of a plurality of electron beams to be used for drawing on a plurality of shot regions SH having an arbitrary size, that is, an arbitrary pitch and adjusting the widths of stripes to be drawn by the electron beams of the group. In the present invention, the relationship shown in FIG. 6B holds between the pitch Ps of the shot regions SH, the pitch Pc of the drawing regions of the electron optical systems 100, and the width (stripe width) SW of the drawing regions of the electron optical systems 100 in the direction perpendicular to the stage scan direction. That is, the stripe width SW is adjusted to be a divisor of both the pitch Ps of the shot regions SH and the pitch Pc of the drawing regions of the electron optical systems 100.

In the arrangement relation shown in FIG. 6B, each shot region SH is evenly divided at the same dividing position and width by stripes each having the width SW. The boundary between the shot regions matches the boundary between drawing regions by the stripes. Hence, intermediate data to be held in the intermediate data memory 20 can be shared on a basis of a stripe that divides the shot regions SH by an integer, and the scale of the storage for holding data can be reduced. In addition, since a drawing region by a stripe never extend over adjacent shot regions, correction can be done using a correction amount that changes depending on the shot region.

A condition to establish the arrangement relation shown in FIG. 6B is to meet both $$SW \leq SW0 \quad (1)$$

$$SW = Pc/\alpha = Ps/\beta \text{ ($\alpha$ and $\beta$ are natural numbers)} \quad (2)$$

The stripe width SW can be set to an amount close to the width SW0 of the drawing enable region based on the pitch Ps of the shot regions from the viewpoint of productivity. More specifically, the data conversion calculator 19 first determines the natural number β corresponding to the number of divisions of a shot region by stripes from the value Ps/SW0, and determines Ps/β as the stripe width SW. The stripe width SW can be adjusted on a basis of column pitch of electron beams (pitch of drawing pixels). The stripe width SW can finely be adjusted on a basis of a unit equal to or smaller than the pitch of drawing pixels by adjusting the projection magnification (reduction ratio) of the electron optical system 100 by the electron lens control circuit 22. When the projection magnification is adjusted, the pitch of drawing pixels also changes by a small amount. In this case, β is adjusted again to make the stripe width SW match a multiple of the column pitch of electron beams, or adjusted such that the adjustment amount of the projection magnification becomes smaller.

After the stripe width SW is determined in this way, the data conversion calculator 19 adjusts the pitch Pc of the drawing regions of the electron optical system 100 to a multiple of the stripe width SW. The pitch Pc of the drawing regions of the electron optical system 100 is basically determined by a mechanical fixed position. However, the deflector 107 of each electron optical system 100 can perform fine adjustment. The pitch Pc of the drawing regions of the electron optical system 100 may be adjusted using the excess region width (SW0−SW) generated when the stripe width SW is adjusted within the range of the width SW0 of the drawing enable region. The stripe width SW is much smaller than the pitch Pc of the drawing regions of the electron optical system 100. The pitch Pc of the drawing regions of the electron optical system 100 which meets the condition can be determined by adjustment in an amount as small as the stripe width SW.

If the adjustment amount of the pitch Pc of the drawing regions of the electron optical system 100 is large and falls outside the adjustable range by the deflector 107 or the excess region width (SW0−SW), adjustment is performed again from β. This makes it possible to do adjustment such that the adjustment amount of the pitch Pc of the drawing regions of the electron optical system 100 falls within the adjustable range. With the above-described method, the data conversion calculator 19 determines the stripe width SW and the pitch Pc of the drawing regions of the electron optical system 100 which meet both expressions (1) and (2). According to the present invention, it is possible to prevent drawing regions by one electron optical system 100 from extending over two shot regions without mechanically adjusting the electron optical systems 100 and changing the pitch between them.

The stripe width SW may be determined by performing adjustment such that the stripe width SW becomes the greatest common divisor of the pitch Pc of the drawing regions of the electron optical system 100 and the pitch Ps of the shot regions. More specifically, the data conversion calculator 19 first obtains a greatest common divisor γ of the pitch Pc of the drawing regions of the electron optical system 100 and the pitch Ps of the shot regions. The data conversion calculator 19 then determines, from a value γ/SW0, the value of a natural number corresponding to a number obtained by dividing the width of the greatest common divisor of the pitch Pc of the drawing regions of the electron optical system 100 and the pitch Ps of the shot regions by stripes, and subsequently determines the stripe width SW by the same method as described above.

When performing sequential drawing on a plurality of divided drawing regions, as in stripe drawing according to this embodiment, the drawing position shifts between the drawing regions due to aging or the like of the electron optical system 100. Especially, an error may occur in the shape of a drawing pattern across the boundary between the drawing regions. To cope with the shift of the drawing position that occurs due to such aging or the like, an overlap region where multiple drawing is performed in drawing regions (target portions) adjacent to each other at the boundary portion of the drawing regions may be provided. In addition, when performing overlay drawing on an already drawn underlayer pattern, the drawing data may be corrected. To cope with such correction, an overlap region extending over regions adjacent to each other at the boundary portion of the drawing regions may be provided. When providing the overlap region, the data conversion calculator 19 adjusts the stripe width SW in consideration of a width OW of the overlap region. In this case, expression (1) changes to $$SW \leq (SW0 - OW) \qquad (3)$$

[Method of Manufacturing Article]

A method of manufacturing an article using the above-described drawing apparatus is suitable for manufacturing an article, for example, a micro device such as a semiconductor device or an element having a fine structure. The method of manufacturing an article can include a step of forming a latent image pattern on a substrate with a photoresist applied on it using the drawing apparatus (a step of performing drawing on a substrate), and a step of developing the substrate on which the latent image pattern is formed in the above step. The manufacturing method can also include other known processes (for example, oxidation, deposition, vapor deposition, doping, planarization, etching, resist removal, dicing, bonding, and packaging). The method of manufacturing an article according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application No. 2013-094640, filed Apr. 26, 2013, which is hereby incorporated by reference herein in its entirety.

What is claimed is:

1. A drawing apparatus for performing drawing on a substrate with a charged particle beam, the apparatus comprising:
   a plurality of charged particle optical systems each configured to irradiate the substrate with a plurality of charged particle beams, the plurality of charged particle optical systems being arrayed at a pitch in a first direction;
   a stage configured to hold the substrate and be moved relative to the plurality of charged particle optical systems in a second direction orthogonal to the first direction; and
   a controller configured to determine charged particle beams, of the plurality of charged particle beams, to be used for the drawing with respect to each of the plurality of charged particle optical systems so as to satisfy a relation given by $SW = Pc/\alpha = Ps/\beta$, where Ps is an array pitch of shot regions on the substrate in the first direction, SW is a width, in the first direction, of each of a plurality of drawing regions on the substrate by each of the plurality of charged particle optical systems, Pc is an array pitch of the plurality of drawing regions in the first direction, and α and β are natural numbers.

2. The apparatus according to claim 1, wherein the controller is configured to perform the determination by defining a designed array pitch of the shot regions on the substrate in the first direction as Ps.

3. The apparatus according to claim 1, wherein the controller is configured to determine a deflection amount of the charged particle beams used for the drawing in at least one of the plurality of charged particle optical systems so as to satisfy the relation.

4. The apparatus according to claim 1, wherein the controller is configured to determine a projection magnification of the plurality of charged particle beams by the plurality of charged particle optical systems so as to satisfy the relation.

5. The apparatus according to claim 1, further comprising a generation device configured to generate drawing data with respect to each of a plurality of partial regions, of each shot region, having the width SW concerning the determination.

6. The apparatus according to claim 5, wherein the generation device includes a storage configured to store the drawing data.

7. The apparatus according to claim 1, wherein the controller is configured to control the plurality of charged particle optical systems such that the charged particle beams used for the drawing are deflected based on information relating to a position of at least one of the shot region formed on the substrate and a portion in the shot region.

8. The apparatus according to claim 7, further comprising a detector configured to detect a mark formed on the substrate,
wherein the controller is configured to obtain the information based on an output of the detector.

9. The apparatus according to claim 1, wherein each of the plurality of charged particle optical systems is configured to irradiate the substrate with the plurality of charged particle beams arrayed along the first direction and the second direction, and perform multiple irradiation of a target portion on the substrate with a plurality of charged particle beams arrayed along the second direction.

10. A method of manufacturing an article, the method comprising:
performing drawing on a substrate using a drawing apparatus;
developing the substrate on which the drawing has been performed; and
processing the developed substrate to manufacture the article,
wherein the drawing apparatus performs drawing on the substrate with a charged particle beam, and includes:
a plurality of charged particle optical systems each configured to irradiate the substrate with a plurality of charged particle beams, the plurality of charged particle optical systems being arrayed at a pitch in a first direction;
a stage configured to hold the substrate and be moved relative to the plurality of charged particle optical systems in a second direction orthogonal to the first direction; and
a controller configured to determine charged particle beams, of the plurality of charged particle beams, to be used for the drawing with respect to each of the plurality of charged particle optical systems so as to satisfy a relation given by $SW=Pc/\alpha=Ps/\beta$, where Ps is an array pitch of shot regions on the substrate in the first direction, SW is a width, in the first direction, of each of a plurality of drawing regions on the substrate by each of the plurality of charged particle optical systems, Pc is an array pitch of the plurality of drawing regions in the first direction, and $\alpha$ and $\beta$ are natural numbers.

* * * * *